United States Patent

Dieny et al.

Patent Number: 5,598,308
Date of Patent: Jan. 28, 1997

[54] MAGNETORESISTIVE SENSOR HAVING MULTILAYER THIN FILM STRUCTURE

[75] Inventors: Bernard Dieny, Grenoble Cedex, France; Bruce A. Gurney, Santa Clara, Calif.; Stuart S. P. Parkin, San Jose, Calif.; Ian L. Sanders, Morgan Hill, Calif.; Virgil S. Speriosu, San Jose, Calif.; Dennis R. Wilhoit, Morgan Hill, Calif.

[73] Assignee: International Business Machines Corporation, Armonk, N.Y.

[21] Appl. No.: 290,324

[22] Filed: Aug. 15, 1994

Related U.S. Application Data

[62] Division of Ser. No. 750,157, Aug. 26, 1991, Pat. No. 5,341,261.

[51] Int. Cl.⁶ .............................. G11B 5/127; G11B 5/33
[52] U.S. Cl. .......................................... 360/113; 338/32 R
[58] Field of Search .......................... 360/113; 338/32 R; 324/252

[56] References Cited

U.S. PATENT DOCUMENTS

| | | | |
|---|---|---|---|
| 4,447,839 | 5/1984 | Desserre et al. | 360/113 |
| 4,940,511 | 7/1990 | Fontana, Jr. et al. | 156/656 |
| 4,949,039 | 8/1990 | Grunberg | 324/252 |
| 5,134,533 | 7/1992 | Friedrich et al. | 360/113 |
| 5,159,513 | 10/1992 | Dieny et al. | 360/113 |
| 5,206,590 | 4/1993 | Dieny et al. | 324/252 |
| 5,341,118 | 8/1994 | Parkin et al. | 338/32 R |

FOREIGN PATENT DOCUMENTS

| | | | |
|---|---|---|---|
| 62-159317 | 7/1987 | Japan | 360/113 |
| 62-234218 | 10/1987 | Japan | 360/113 |
| 2-23679 | 1/1990 | Japan . | |
| 2-23678 | 1/1990 | Japan . | |
| 2-266579 | 10/1990 | Japan . | |

OTHER PUBLICATIONS

G. Binasch et al., "Enhanced Magnetoresistance in Layered Magnetic Structures with Antiferromagnetic Interlayer Exchange," American Physical Society, Mar., 1989, pp. 4828–4830.

I. A. Campbell and A. Fert, *Ferromagnetic Materials*, Chapter 9, "Transport Properties of Ferromagnetics," North–Holland Publishing Company, 1982, V.3, pp. 747–769.

*Primary Examiner*—Stuart S. Levy
*Assistant Examiner*—William J. Klimowicz
*Attorney, Agent, or Firm*—Leslie G. Murray

[57] ABSTRACT

A magnetoresistive (MR) sensor comprising a layered structure having at least one trilayer comprising a first and a second thin film ferromagnetic layers separated by and in interfacial contact with a third thin film non-metallic magnetic layer. A fourth thin film layer of material is within the first ferromagnetic layer, and the fourth layer has a thickness between a fraction of a monolayer and several monolayers and is located at predetermined distance from the interface between the first and third layers. A current flow is produced through the MR sensor and variations in resistivity of the MR sensor produced by rotation of the magnetization in one or both of the ferromagnetic layers is sensed as a function of the magnetic field being sensed.

7 Claims, 11 Drawing Sheets

NiFe(60-x)/ Co(x)/ Cu(30Å)/ Co(5x)/ NiFe(25-x)/ MnFe(100Å)/ Cu(10Å)

NiFe(80-x)/ Co(x)/ Cu(30Å)/ Co(35Å)/ MnFe(130Å)/ Cu(10Å)

MAGNETORESISTIVE SENSOR HAVING MULTILAYER THIN FILM STRUCTURE

This is a divisional of application Ser. No. 07/750,157 filed on Aug. 26, 1991, now U.S. Pat. No. 5,341,261.

BACKGROUND OF THE INVENTION

1. Field of the Invention

This invention relates in general to magnetic transducers for reading information signals from a magnetic medium and, in particular, to an improved magnetoresistive read transducer.

2. Description of the Invention

The prior art discloses a magnetic transducer referred to as a magnetoresistive (MR) sensor or head which has been shown to be capable of reading data from a magnetic surface at great linear densities. An MR sensor detects magnetic field signals through the resistance changes of a read element made from a magnetic material as a function of the amount and direction of magnetic flux being sensed by the element. These prior art MR sensors operate on the basis of the anisotropic magnetoresistive (AMR) effect in which a component of the resistance varies as $\cos^2$ of the angle between the magnetization and the direction of current flow. These MR sensors have operated on the basis of the AMR effect even though this effect produced only a very small percentage change in the resistance.

More recently, reports have been published of techniques for obtaining enhanced MR effects. One of these publications, "Enhanced Magnetoresistance in Layered Magnetic Structures with Antiferromagnetic Interlayer Exchange", G. Binasch et al., Phys. Rev. B. V39, p. 4828 (1989) and U.S. Pat. No. 4,949,039 describe a layered magnetic structure which yields enhanced MR effects caused by antiparallel alignment of the magnetization. However the saturation fields required to obtain these changes in resistance were too high and the effect too nonlinear and therefore unsuitable for producing a practical MR sensor.

In order for the MR phenomena in multilayered structures to be of technological importance, it is necessary to achieve large changes in resistance at relatively low saturation fields, so that the rate of change of MR vs. applied field can be optimized.

SUMMARY OF THE INVENTION

It is therefore the principal object of this invention to produce an MR sensor which produces large changes in resistance at low saturation fields.

In accordance with the invention, an MR sensor comprises a layered structure having at least two bilayers each comprising a first thin film layer of ferromagnetic material in interfacial contact with a second thin film layer of non-magnetic material. A third thin film layer of material is within the first layer of ferromagnetic material, and this third layer of material has a thickness of between a fraction of a monolayer and several monolayers and is located at a predetermined distance X from the interface between the first and second thin film layers. A current flow is produced through the MR sensor, and the variations in resistivity of the MR sensor produced by rotation of the magnetization in the first thin film layer of ferromagnetic material is sensed as a function of the magnetic field being sensed.

In a specific embodiment of the invention, the MR sensor comprises a trilayer structure having a first and a second thin film layer of ferromagnetic material separated by and in interfacial contact with a third thin film of non-magnetic metallic material. In this case a thin film layer of material is provided in either or both of the ferromagnetic layers.

In a further specific embodiment of the invention, the MR sensor comprises a trilayer structure having a first and a second thin film layer of ferromagnetic material separated by and in interfacial contact with a third film of non-magnetic metallic material. In this case a thin film layer of ferromagnetic material is provided at either or both of the interfaces between the ferromagnetic layers and the thin film layer of non-magnetic material.

All of the described embodiments produce an MR response in which the magnitude of the response is high and the field required to produce this change in resistance is no greater than prior art structures which produce much lower MR response The foregoing and other objects, features and advantages of the invention will be apparent from the following more particular description of a preferred embodiment of the invention as illustrated in accompanying drawings.

DESCRIPTION OF THE PREFERRED EMBODIMENTS

Recently, giant values of magnetoresistance have been identified in multilayered structures of the form $[F/NM]_n$ where F is a thin layer of ferromagnetic material such as iron (Fe) or cobalt (Co) and NM is a non-magnetic spacer layer such as chromium (Cr) or copper (Cu). Observation of large values of magnetoresistance in such multilayers are found for structures in which the F layers are exchange coupled antiparallel to one another via the NM layer. Typically, magnetic fields in the range of several hundred Oe are required to obtain these changes in resistance.

Figure 1:
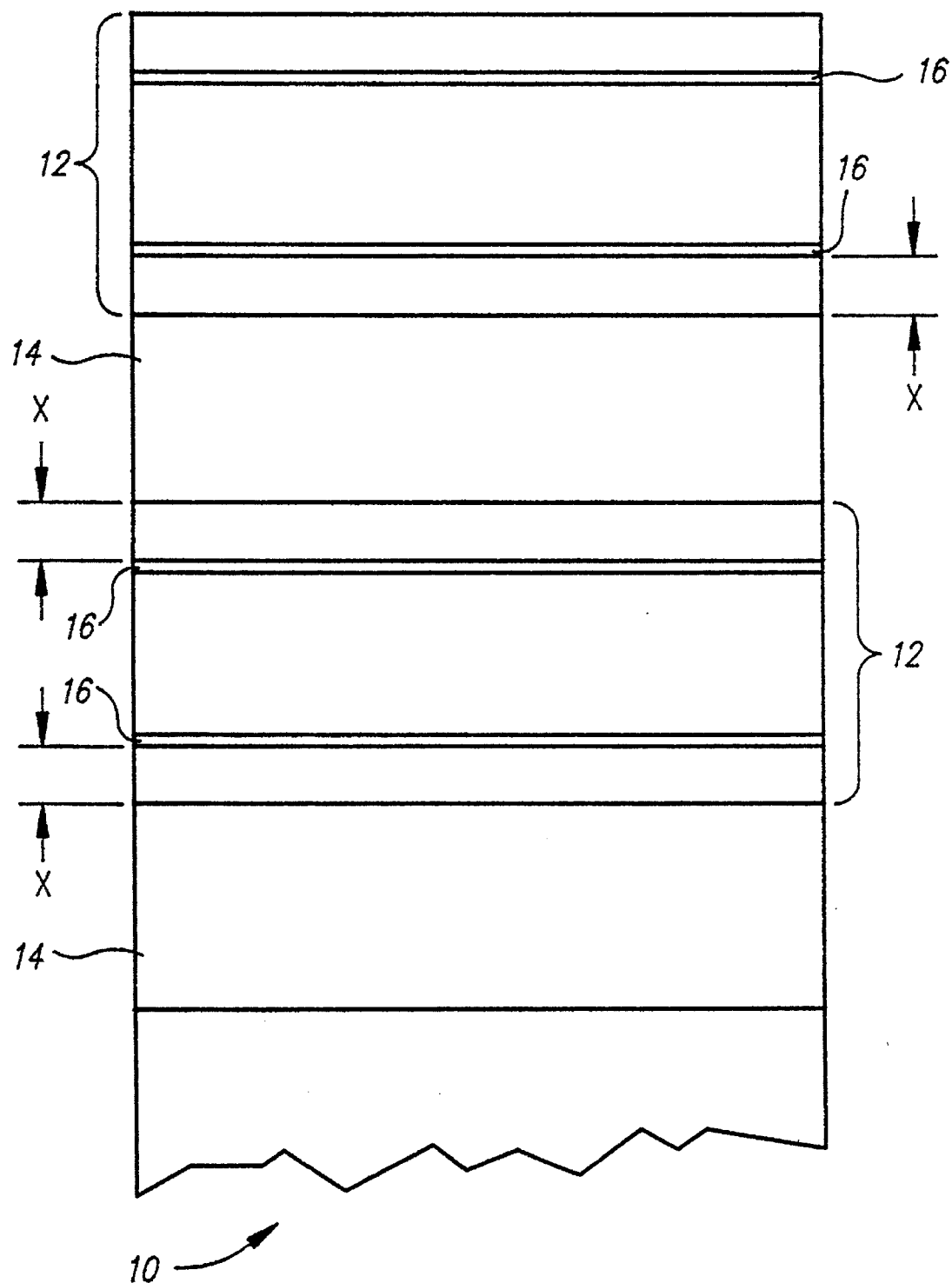
FIG. 1 is a diagrammatic schematic view of a specific embodiment of the magnetoresistive sensor according to the present invention.

A specific embodiment of a multilayered structure, according to the present invention, is shown in FIG. 1. The magnetoresistive (MR) sensor 10 shown in FIG. 1 comprises repeated bilayers of a thin layer of a ferromagnetic material 12 and a non-magnetic material 14. According to the present invention, a thin layer of material 16 is located within the layer of ferromagnetic material 12 at a distance x from the interface between ferromagnetic layer 12 and non-magnetic layer 14. As will be shown in greater detail below, the addition of this thin layer of material 16 within the ferromagnetic layer 12 increases the magnitude of the magnetoresistance without substantially increasing the applied magnetic field.

Another structure that has recently been identified comprises a sandwich structure of the form $F_1/MN/F_2/AF$. Low saturation fields have been obtained for these sandwich structures by exchange biasing the $F_2$ layer with an antiferromagnetic (AF) layer such as MnFe. Values of MR in the range of 3–5% can be obtained for these structures for fields in the 10 Oe range. Other structures require a much larger saturation field, by a factor of approximately 5 times larger.

Figure 2:
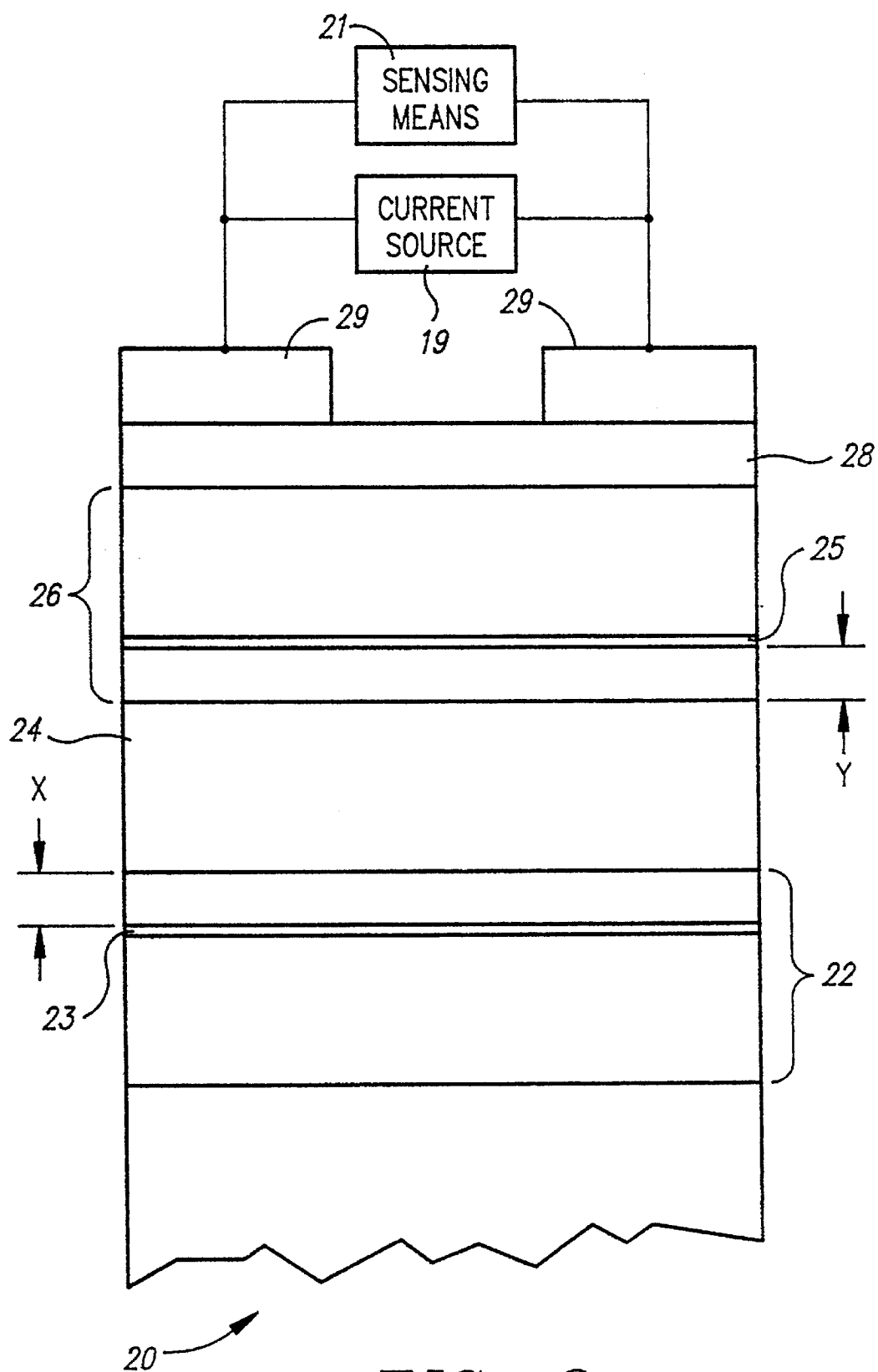
FIG. 2 is an end view of an alternate embodiment of the magnetoresistive sensor according to the present invention.

A specific embodiment of sandwich structure, according to the present invention, is shown in FIG. 2. The MR sensor 20 shown in FIG. 2 comprises a first layer of ferromagnetic material 22, a layer of non-magnetic material 24, a second layer of ferromagnetic material 26, and a layer of antiferromagnetic material 28. Electrical leads 29 are provided to form a circuit path between the MR sensor structure, current source 19 and sensing means 21. Other layers (not shown) may also be provided for various biasing fields, for example, as is known in the art. Current source 19 produces a current flow through the MR sensor, and sensing means 21 provides circuits to sense the variations in voltage across the MR sensor produced by changes in resistance of the MR sensor due to rotation of the magnetization in the first ferromagnetic layer 22 as a function of the magnetic field being sensed.

According to the present invention, a thin layer of material 23 is located within the first layer of ferromagnetic material 22 at a distance x from the interface between ferromagnetic layer 22 and non-magnetic layer 24. A second thin layer of material 25 may also be located within the second layer of ferromagnetic material 26 at a distance y from the interface between ferromagnetic layer 26 and non-magnetic layer 24. The addition of these thin layers of material 23, 25 substantially increases the magnitude of the magnetoresistance with a low applied field.

Figure 3:
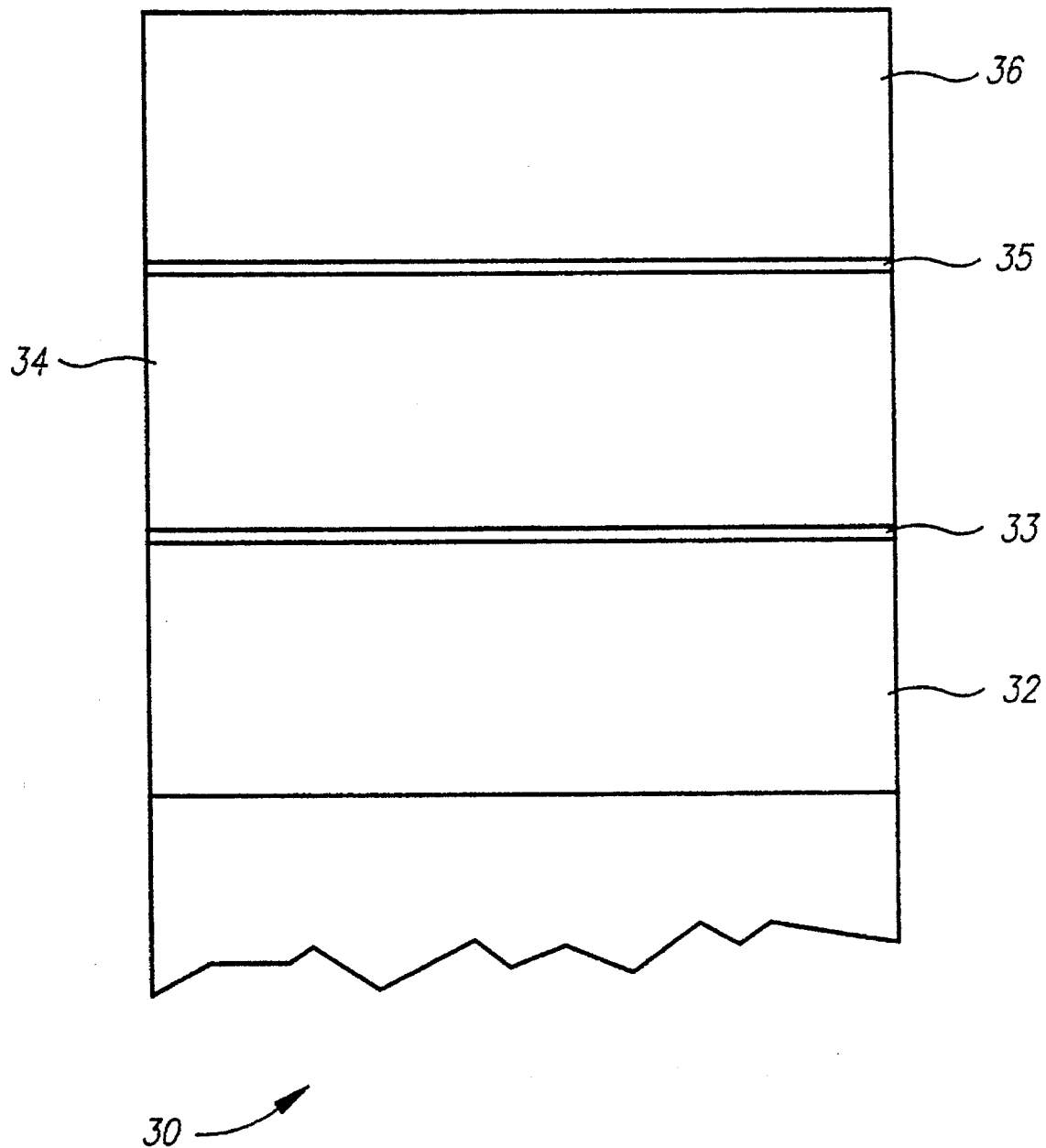
FIG. 3 is a diagrammatic schematic view of a further embodiment of the magnetoresistive sensor according to the present invention.

A further embodiment of an MR sensor, according to the present invention, is shown in FIG. 3. The MR sensor 30 shown in FIG. 3 comprises a special case of the previously described embodiments in which the distance x and y is zero. This structure comprises a first layer of ferromagnetic material 32, a layer of non-magnetic material 34, and a second layer of ferromagnetic material 36. A thin layer of ferromagnetic material 33 is located at the interface between ferromagnetic layer 32 and the layer of non-magnetic material 34. A second thin layer of ferromagnetic material 35 may also be located at the interface between the second layer of ferromagnetic material 36 and the layer of non-magnetic material 34.

The purpose of thin layers of material 16, 23, 25, 33 and 35 is to produce a localized region whose spin dependent scattering properties are different from the layer of ferromagnetic material into which the localized regions are introduced. The thin layers of material 16, 23, 25, 33 and 35 have a thickness of a fraction of a monolayer to several monolayers or more of material, so these layers will be referred to as nanolayers. The materials for the nanolayers are metallic, and their characteristics are chosen based on the ferromagnetic materials into which they are introduced. The book, FERROMAGNETIC MATERIALS, Vol. 3, edited by E. P. Wohlfarth, North-Holland (1986) has on pages 766–9, Tables 1,2 and 3 which report the residual resistivity and temperature dependence of resistivity for a number of impurities in nickel(Ni), Co, and Fe as well as spin dependent impurity scattering resistivities. These tables provide examples of materials that are candidates for use as the nanolayers for the respective ferromagnetic materials, as well. These and other materials may also be chosen because of their spin dependent electron scattering properties derived from induced strain, or introduced defects, or caused by the change in electronic band structure that the nanolayer introduces. Note that some of these materials are ferromagnetic and some of these materials are non-magnetic. Only the ferromagnetic materials are suitable for use as thin film layers 33 and 35.

To demonstrate the increase in magnetoresistance obtainable by the present invention, a specific embodiment of multilayered structures as shown in FIG. 1 were produced with the ferromagnetic layer 12 formed of Fe, the non-magnetic layer 14 formed of Cr, and the nanolayer of material 16 was also formed of Cr. The structures were prepared on a silicon (Si) substrate with a Cr underlayer as follows:

$$Si/Cr(30\ \text{Å})/[Fe(X\text{Å})/Cr(1\ \text{Å})/Fe(40-2X\text{Å})/Cr(1\ \text{Å})/Fe(X\text{Å})/Cr(t_{cr})]^{30}/Cr(50\ \text{Å})$$

Figure 4:
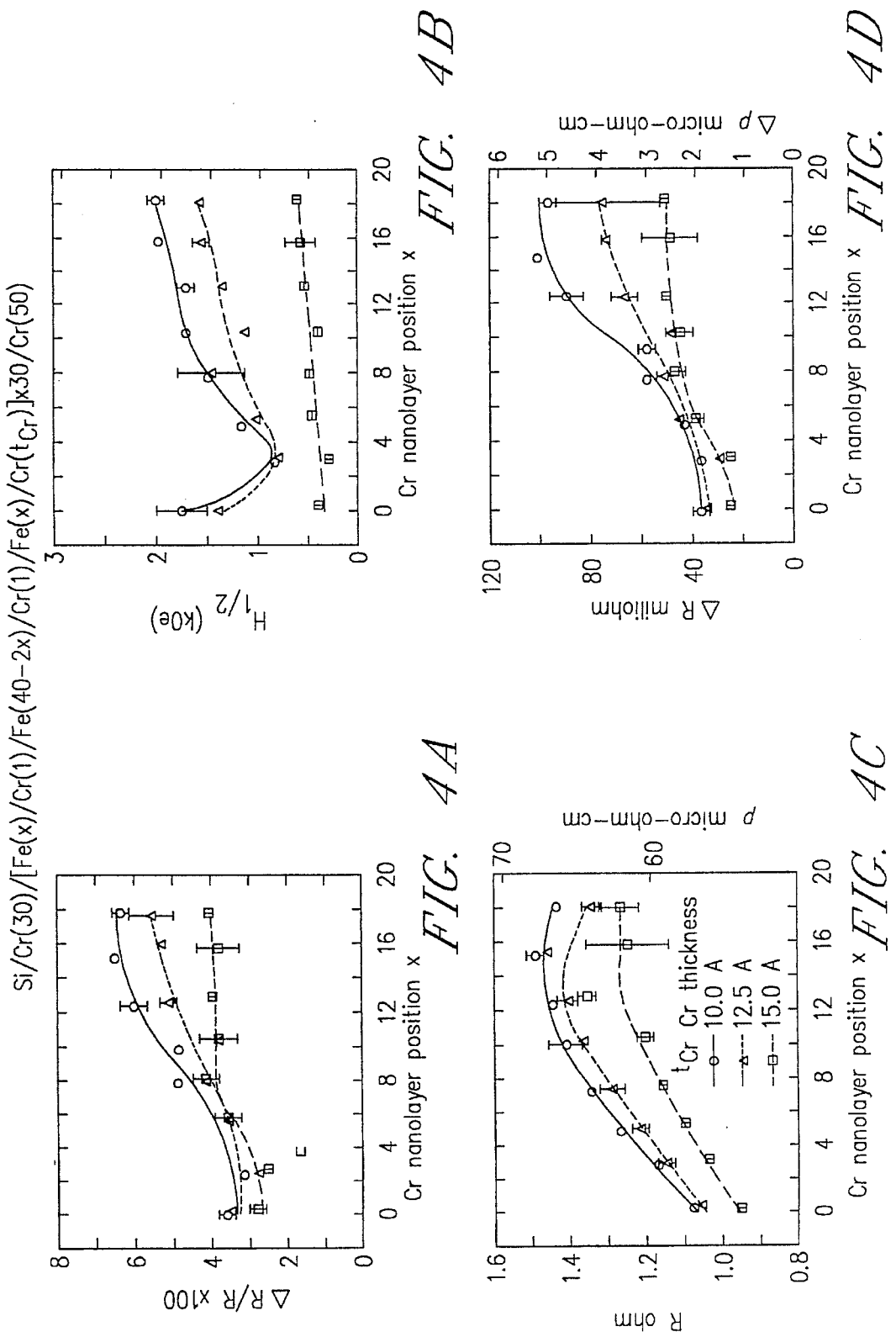
FIGS. 4(a)–4(d) comprise four related graphs a–d which show magnetic and resistive characteristics for a specific embodiment of the magnetoresistive sensor of FIG. 1.

Films comprising Fe/Cr multilayers with thin Cr nanolayers placed within the Fe layers were deposited by rf sputtering on Si substrates, and the resistance as a function of applied field measured. The Cr nanolayers consisted of 1 Å of material deposited within the Fe layer at at distance x from the Fe/Cr interface that was systematically varied from 0 to 17.5 Å. Three series of films were deposited with the Cr layer thickness, $t_{cr}$, of 10 Å, 12.5 Å, and 15 Å. Note that, for films made within each of these three types, the only change is in the location of the nanolayer, and the total amount of each element is kept fixed. The results of the measurements on these structures is shown in FIG. 4 in a set of four related graphs in which (a) is the observed film resistance at high applied field, (b) is the change in resistivity $\Delta\rho$ when the magnetic layers were saturated in an applied field, (c) is the relative change in resistivity $\Delta\rho/\rho$ (typically referred to as giant magnetoresistance), and (d) is the field required to reduce the resistivity by half of its total excursion, $H_{1/2}$ (roughly half the saturation field). It can be seen from these graphs that the change in resistivity $\Delta\rho$ dramatically increases as the nanolayer is positioned further from the interface. This increase saturates once the nanolayer is positioned more than about 10 Å from the interface.

Figure 5:
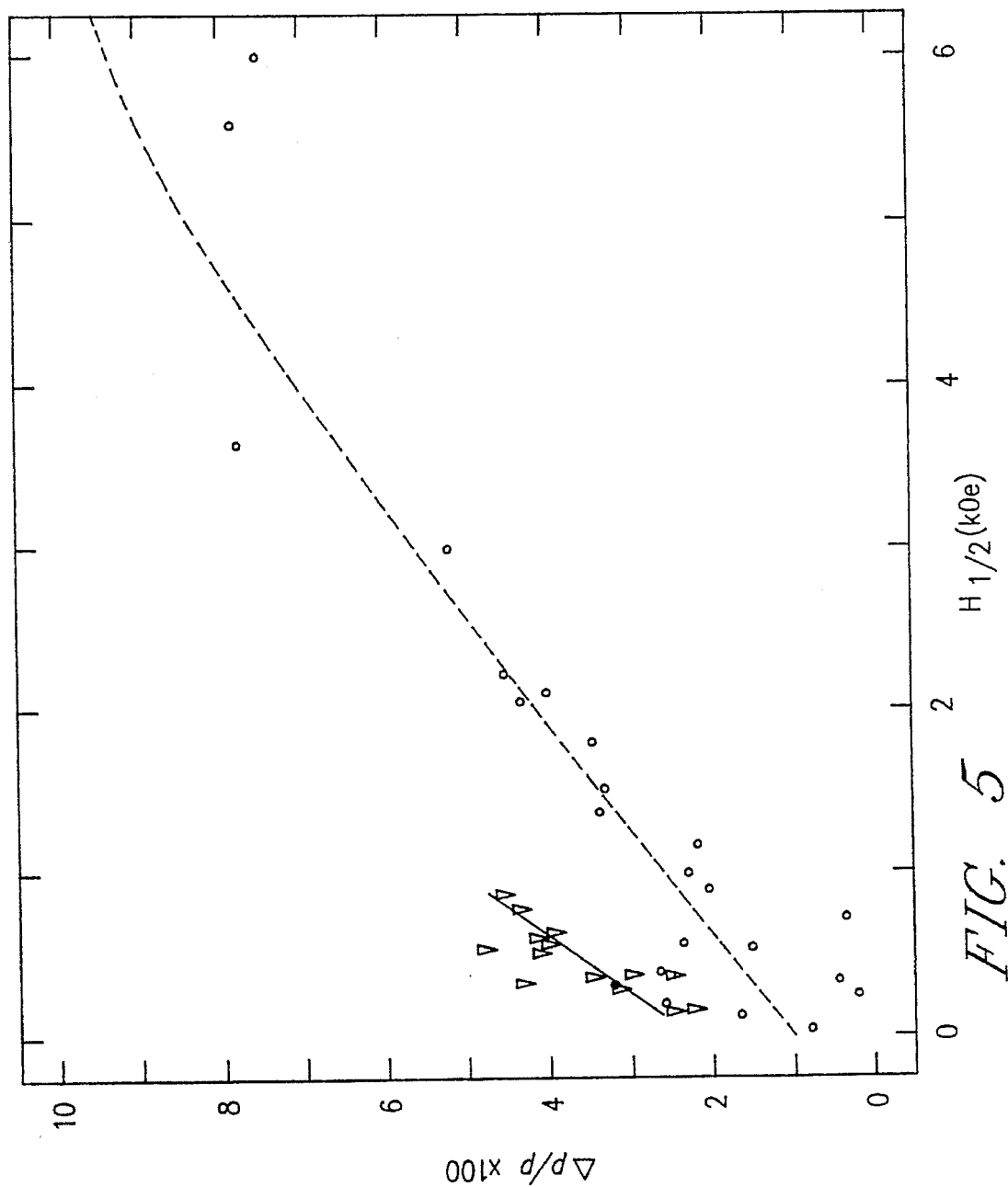
FIG. 5 is a graph showing magnetoresistance vs magnetic field at half saturation for a plurality of magnetoresistive sensors of the type shown in FIG. 1.

The magnetoresistance values for a given saturation field obtained by nanolayering are consistently larger than those obtained from conventional Fe/Cr films. This is easily seen by plotting the magnetoresistance $\Delta R/R$ vs $H_{1/2}$ for films fabricated in each of these ways. FIG. 5 shows this comparison in which all conventional Fe/Cr films that we have produced fall into a narrow band around the dotted line. Shown for comparison are the nanolayer films with $t_{cr}$=15 Å. These films clearly deviate from the dotted line toward higher magnetoresistance for a given saturation field. This data shows that, by the addition of the nanolayer, an improvement by a factor of two in magnetoresistance is obtained, for a given saturation field, over that obtainable with any conventional Fe/Cr film.

It can be seen from FIG. 4 that the increase in magnetoresistance is not great for X=0. However, this data is taken for a structure in which the nanolayer is non-magnetic material, Cr. It has been discovered that, with x=0 (ie, a nanolayer at the interface between the ferromagnetic layer 22 and the non-magnetic layer 24) and where the thin layer of material 23 is a ferromagnetic material, a substantial increase in magnetoresistance is produced, for certain magnetic and non-magnetic materials.

Figure 6:
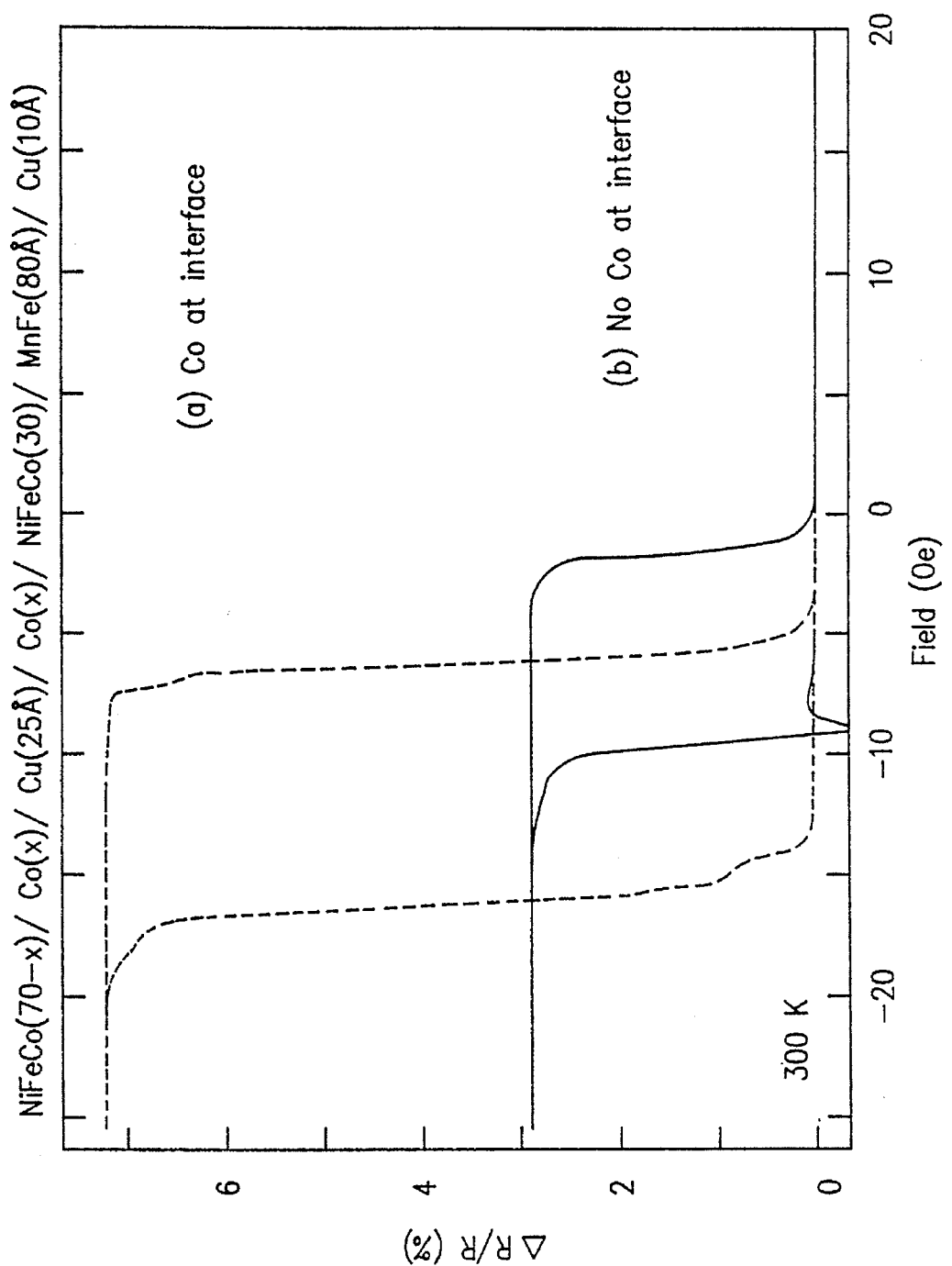
FIG. 6 is a graph showing a comparison of two structures of the type shown in FIG. 3 for which only one of the structures has interface layers.

This increase in magnetoresistance that can be obtained by this structure is graphically demonstrated in FIG. 6 in which the bottom curve shows the MR response for a structure without nanolayering and the top curve shows the MR response for the same structure with the addition of nanolayers. The structure for the bottom curve comprises:

NiFeCo(70 Å)/Cu(25 Å)/NiFeCo(30 Å)/MnFe(80 Å)/Cu(10 Å)

The structure for the top curve comprises:

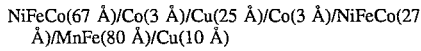
NiFeCo(67 Å)/Co(3 Å)/Cu(25 Å)/Co(3 Å)/NiFeCo(27 Å)/MnFe(80 Å)/Cu(10 Å)

The data in FIG. 6 clearly demonstrates a doubling of the MR response by insertion of a Co layer just 3 Å thick at the NiFeCo/Cu interfaces. The field required to obtain the doubled MR is not significantly increased.

Figure 7:
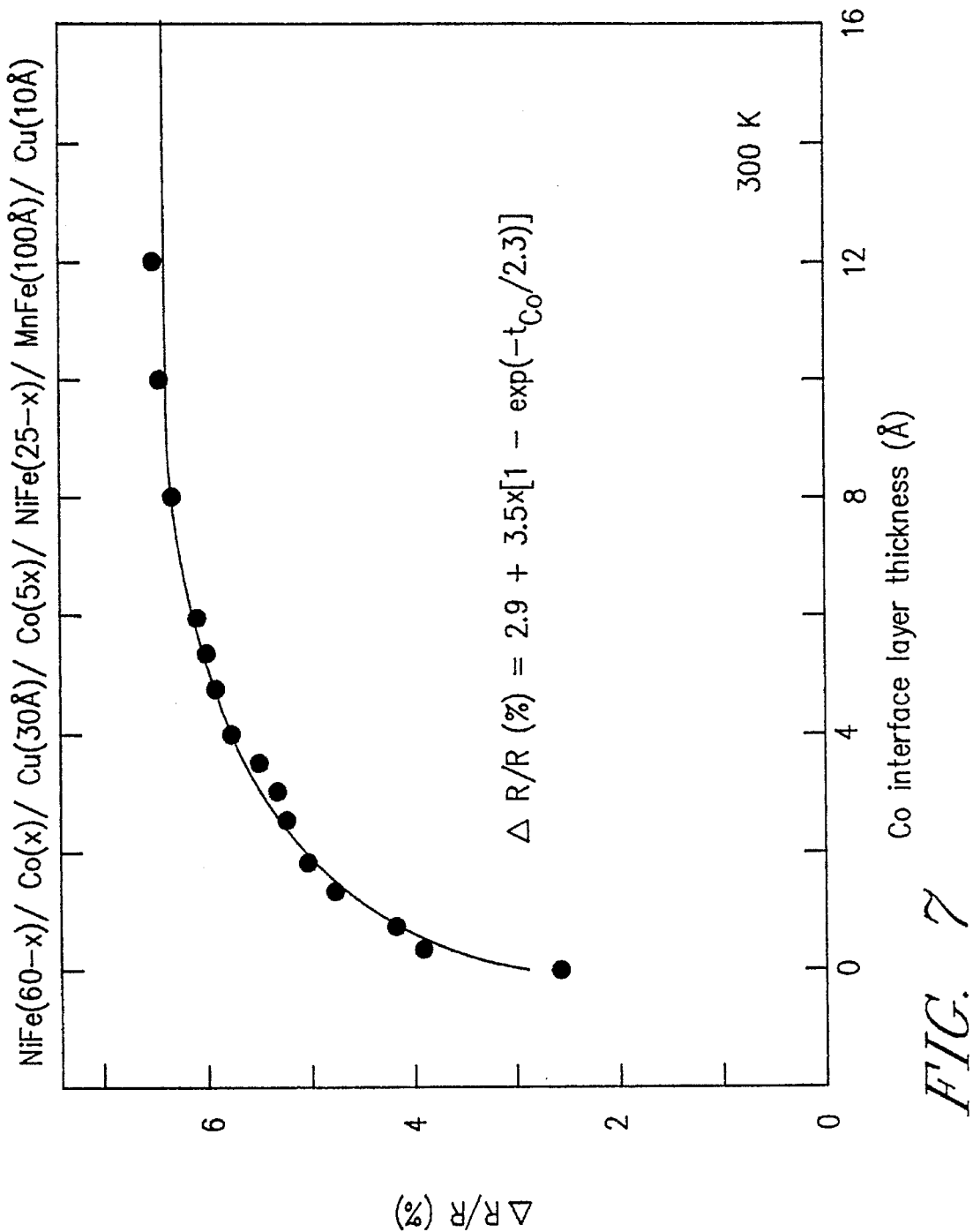
FIG. 7 is a graph showing the variation in MR response with thickness of a Co interface layer.

FIG. 7 shows the dependence of the MR response on the thickness of the interface layer 23, 25 which in this embodiment is Co. The structure is of the same form as that considered in FIG. 6 and comprises:

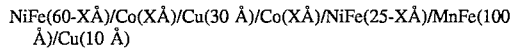
NiFe(60-XÅ)/Co(XÅ)/Cu(30 Å)/Co(XÅ)/NiFe(25-XÅ)/MnFe(100 Å)/Cu(10 Å)

The data of FIG. 7 shows that the MR response increases rapidly with increasing Co thickness and then levels out with further increasing thickness. Increased Mr response has been noted for the thin interface layers from 0.5 to 20 Å, and the preferred thickness range is from about 3 to about 20 Å.

Figure 8:
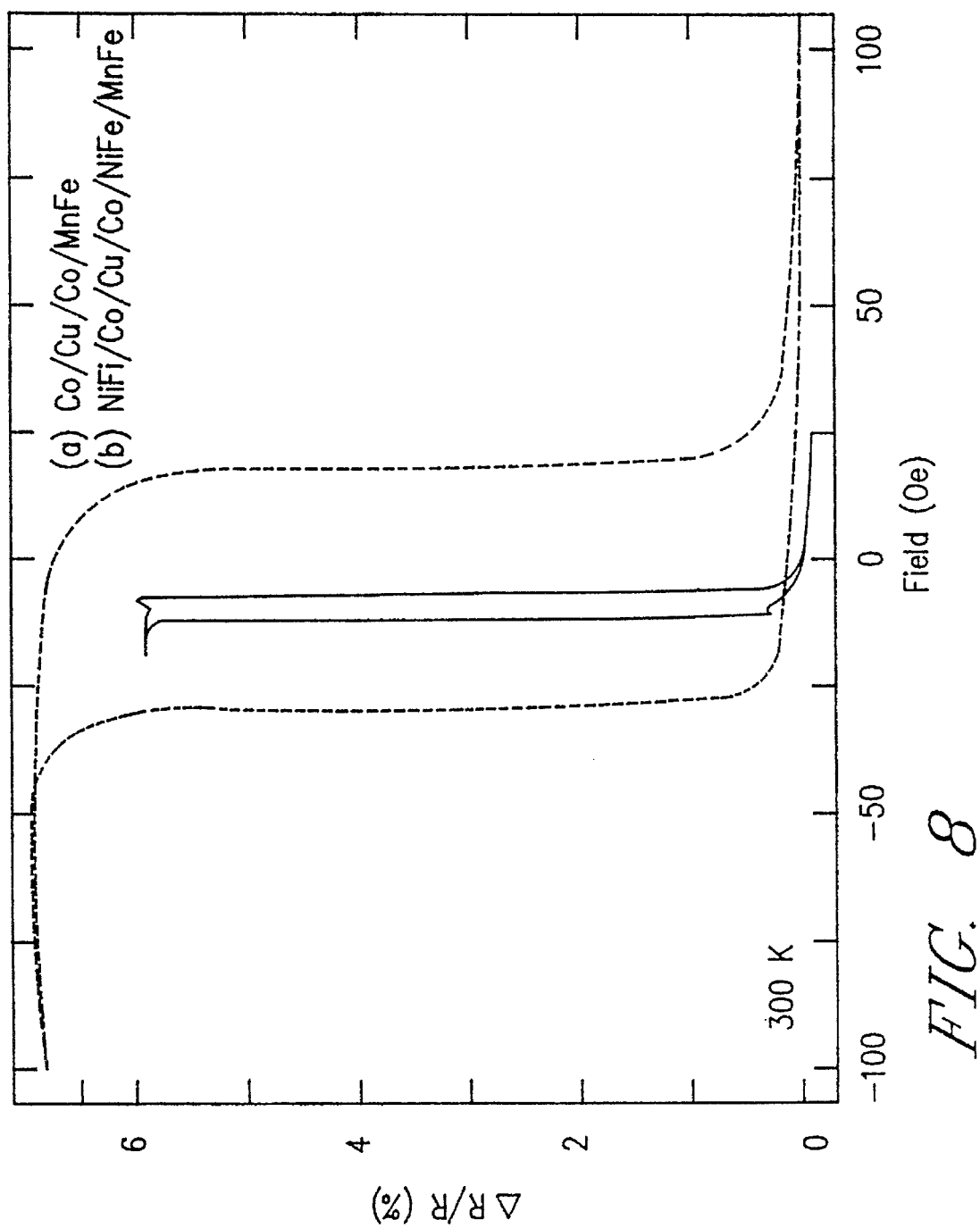
FIG. 8 is a graph showing the room temperature magnetoresistance versus magnetic field for two specific structures of the type shown in FIG. 3.

FIG. 8 shows a comparison of the MR response for a Co/Cu/Co sandwich structure of the form:

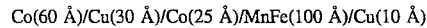
Co(60 Å)/Cu(30 Å)/Co(25 Å)/MnFe(100 Å)/Cu(10 Å)

and a NiFe/Cu/NiFe/MnFe structure with a thin Co interface layer of the form:

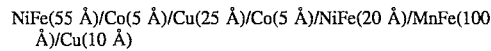
NiFe(55 Å)/Co(5 Å)/Cu(25 Å)/Co(5 Å)/NiFe(20 Å)/MnFe(100 Å)/Cu(10 Å)

The data clearly shows that, while the magnitude of the MR response have similar values, the NiFe/Co based structure has a much smaller saturation field.

Figure 9:
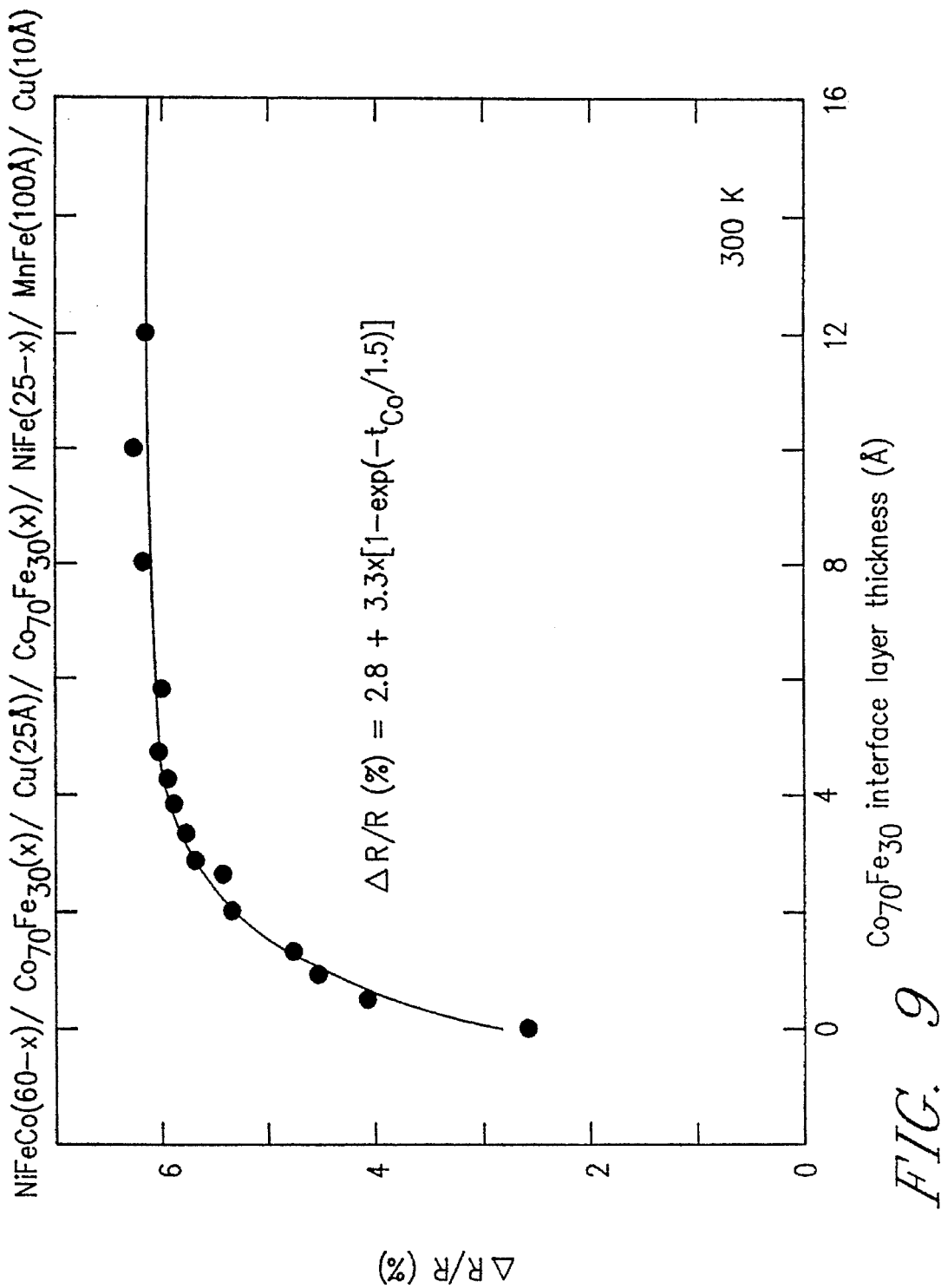
FIG. 9 is a graph showing the variations in MR response with thickness of a $Co_{70}Fe_{30}$ interface layer.

FIG. 9 shows that the interface layer can also be an alloy rather than an elemental layer. This structure is of the form:

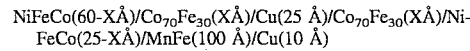
NiFeCo(60-XÅ)/Co$_{70}$Fe$_{30}$(XÅ)/Cu(25 Å)/Co$_{70}$Fe$_{30}$(XÅ)/NiFeCo(25-XÅ)/MnFe(100 Å)/Cu(10 Å)

This structure shows a similar dramatic increase in MR response with thickness of the Co$_{70}$Fe$_{30}$ layer.

Figure 10A:
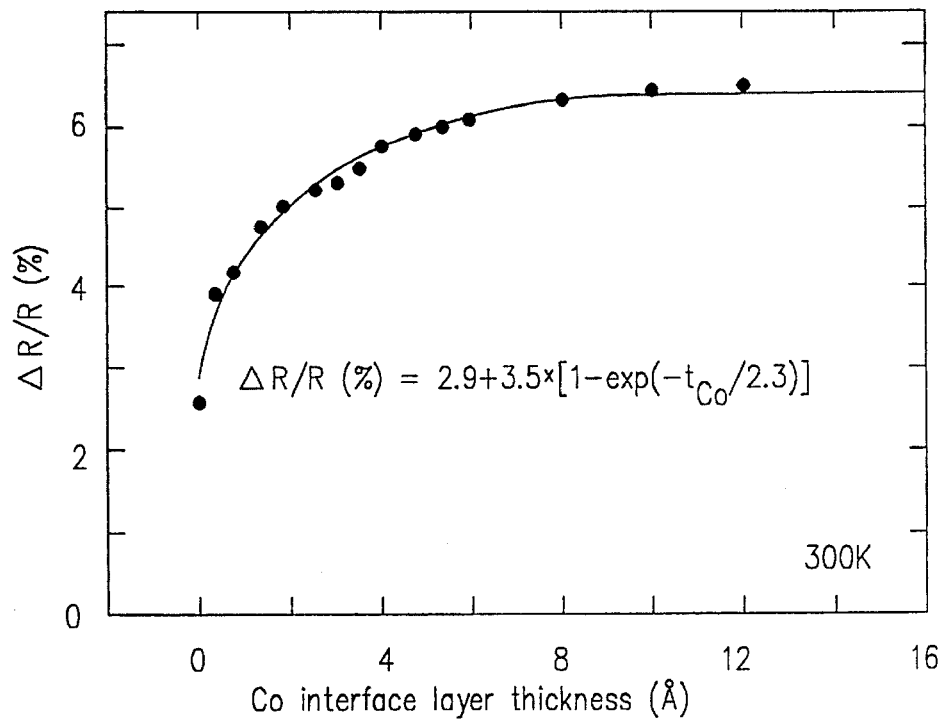
FIG. 10 is two related graphs showing the variation in MR response with thickness of a Co interface layer for structures with two interface layers (top) and with structures having one interface layer (bottom).
Figure 10B:
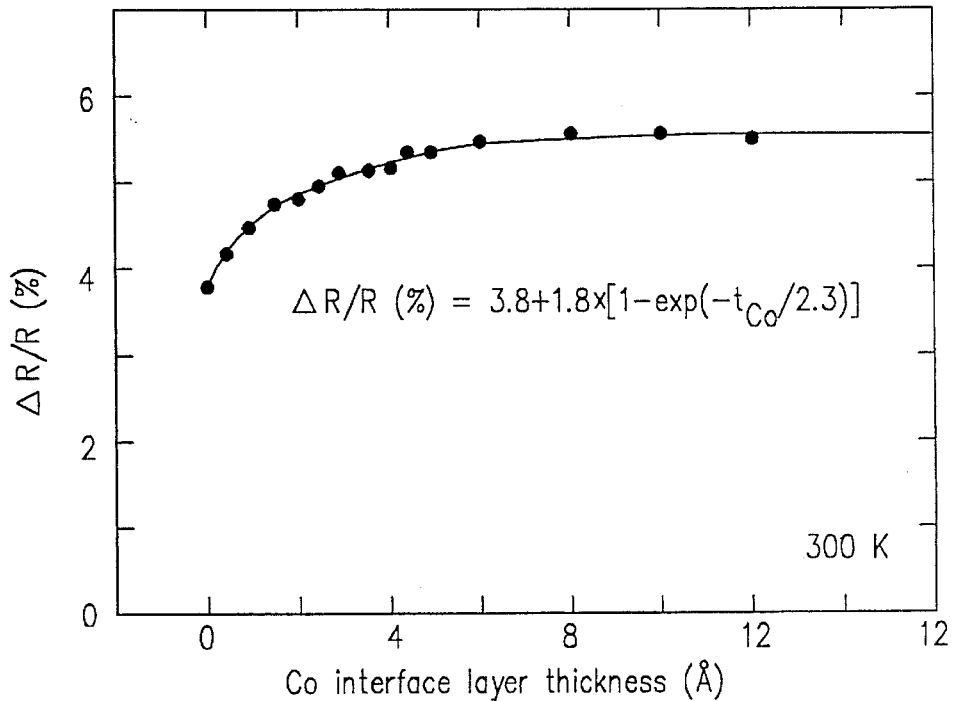

FIG. 10 shows a comparison of a structure that has an interface layer at both interfaces with a similar structure which has an interface layer at one of the F/NM interfaces. The top figure shows data for a structure comprising:

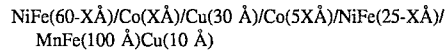
NiFe(60-XÅ)/Co(XÅ)/Cu(30 Å)/Co(5XÅ)/NiFe(25-XÅ)/MnFe(100 Å)Cu(10 Å)

The bottom figure shows data for a similar structure comprising:

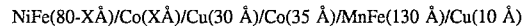
NiFe(80-XÅ)/Co(XÅ)/Cu(30 Å)/Co(35 Å)/MnFe(130 Å)/Cu(10 Å)

In the bottom figure, since an interface layer is provided on only one of the interfaces, the MR response only increases by 47% in this embodiment, approximately half the increase found in the top figure in which two interface layers were used.

Figure 11:
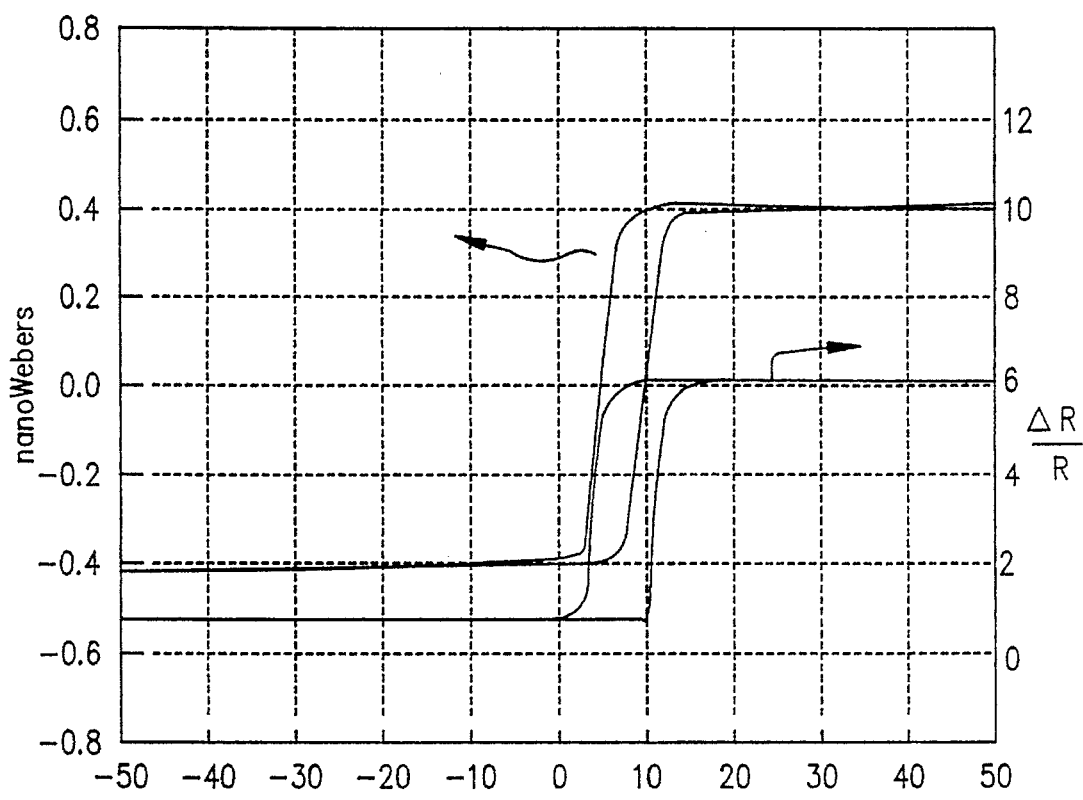
FIG. 11 is a graph which shows that B-H loop and the MR response for a specific embodiment of a layered magnetic structure similar to that of FIG. 3.
Figure 12:
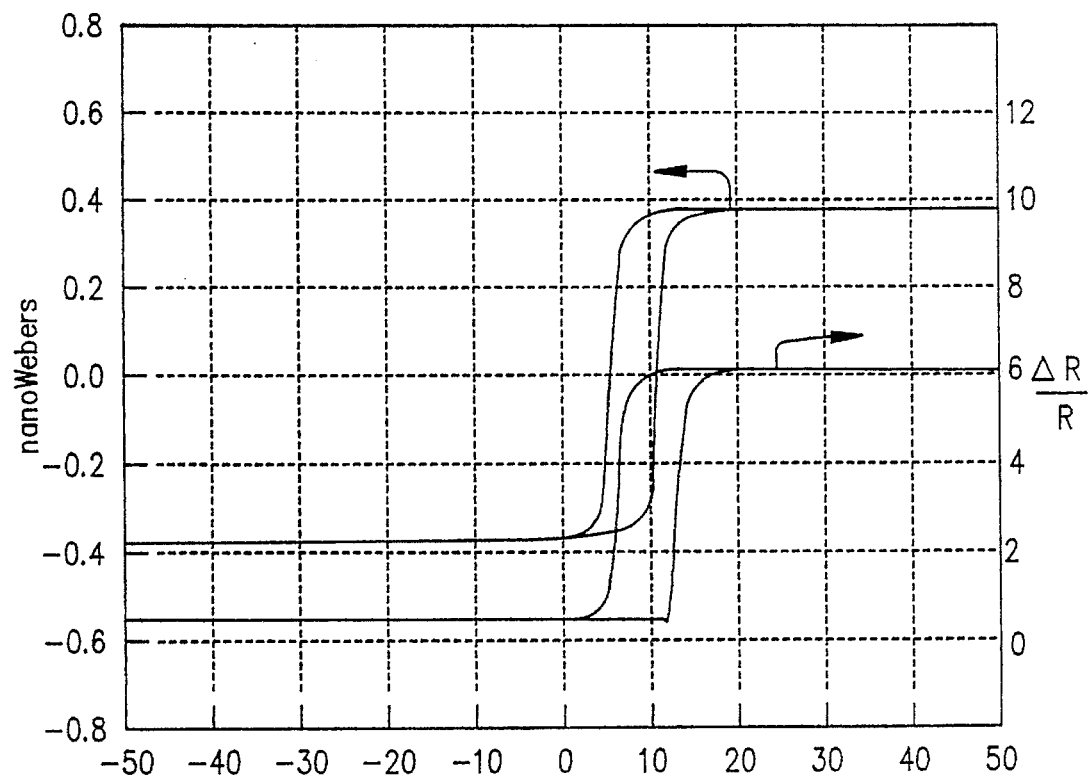
FIG. 12 is a graph which shows that B-H loop and the MR response for a further specific embodiment of a layered magnetic structure similar to that of FIG. 3.

The MR response is still substantial for a structure in which a single interface layer in used, and the value remains high with increasing thickness of the interface layer as shown in FIGS. 11 and 12. The MR response shown in FIG. 11 is for the following structure:

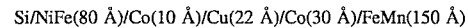
Si/NiFe(80 Å)/Co(10 Å)/Cu(22 Å)/Co(30 Å)/FeMn(150 Å)

This structure shows an MR response of about 5.3% with a 10 Å Co interface layer. The MR response in FIG. 12 is for the following structure:

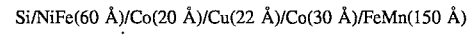
Si/NiFe(60 Å)/Co(20 Å)/Cu(22 Å)/Co(30 Å)/FeMn(150 Å)

This structure shows an MR response of about 5.8% with a 20 Å Co interface layer. This demonstrates that the useful range of thickness of the Co nanolayer is between about 3 Å and about 20 Å.

We have shown that the addition of a thin layer of material will substantially increase the magnitude of the MR response when located within the ferromagnetic layer at a distance x from the interface between the ferromagnetic layer and the non-magnetic layer. We have also shown that, for the special case in which the distance X=0 and the thin layer is a ferromagnetic material, the magnitude of the MR response is also substantially increased. In both cases there is substantially no increase in the magnetic field required to produce the change in resistance.

While the invention has been particularly shown and described with reference to a preferred embodiment thereof, it will be understood by those skilled in the art that various other changes in the form and details may be made therein without departing from the spirit and scope of the invention.

We claim:

1. A magnetoresistive sensor comprising a first layer of ferromagnetic material and a second layer of ferromagnetic material, said first and second ferromagnetic layers separated by a spacer layer of non-magnetic material, each of said first and second ferromagnetic layers being in contact with an adjacent surface of said non-magnetic layer, an interface being formed therebetween, at least one of said first and second ferromagnetic layers including therein a thin layer of metallic material sandwiched within said ferromagnetic layer, said thin layer of metallic material spaced from said interface between said ferromagnetic layer and said spacer layer a distance x, said thin layer of metallic material forming a localized region within said ferromagnetic layer wherein the spin dependent scattering properties are different from the spin dependent scattering properties of said ferromagnetic material.

2. A magnetoresistive sensor as in claim 1 wherein said distance x is in a range from greater than 0 Angstroms to 17.5 Angstroms.

3. A magnetoresistive sensor as in claim 1 wherein each of said first and second ferromagnetic layers includes therein a thin layer of material spaced from the interface between said ferromagnetic layer and said spacer layer a distance x.

4. A magnetoresistive sensor as in claim 3 wherein said thin layer comprises a layer of a non-magnetic material.

5. A magnetoresistive sensor as in claim 3 wherein said thin layer comprises a layer of a magnetic material.

6. A magnetoresistive sensor as in claim 5 wherein said magnetic material comprises cobalt.

7. A magnetoresistive sensor as in claim 6 wherein said thin layer of cobalt has a thickness in the range of about 0.5 Angstroms to 20 Angstroms.

* * * * *

UNITED STATES PATENT AND TRADEMARK OFFICE
CERTIFICATE OF CORRECTION

PATENT NO. : 5,598,308
DATED : January 28, 1997
INVENTOR(S) : Dieny, et al.

It is certified that error appears in the above-indentified patent and that said Letters Patent is hereby corrected as shown below:

IN THE ABSTRACT:
Line 4, "non-metallic magnetic" should be --non-magnetic metallic--.

Signed and Sealed this

Fourteenth Day of October, 1997

Attest:

BRUCE LEHMAN

Attesting Officer     Commissioner of Patents and Trademarks